(12) United States Patent
Kim

(10) Patent No.: US 12,302,577 B2
(45) Date of Patent: May 13, 2025

(54) SEMICONDUCTOR DEVICE AND METHOD OF MANUFACTURING THE SEMICONDUCTOR DEVICE

(71) Applicant: SK hynix Inc., Icheon-si (KR)

(72) Inventor: Jae Seok Kim, Icheon-si (KR)

(73) Assignee: SK hynix Inc., Icheon-si (KR)

(*) Notice: Subject to any disclaimer, the term of this patent is extended or adjusted under 35 U.S.C. 154(b) by 476 days.

(21) Appl. No.: 17/683,701

(22) Filed: Mar. 1, 2022

(65) Prior Publication Data
US 2023/0084756 A1 Mar. 16, 2023

(30) Foreign Application Priority Data

Sep. 13, 2021 (KR) .................... 10-2021-0121617

(51) Int. Cl.
*H10B 43/40* (2023.01)
*H01L 23/535* (2006.01)
*H10B 41/27* (2023.01)
*H10B 41/41* (2023.01)
*H10B 43/27* (2023.01)
*H10B 41/10* (2023.01)
*H10B 43/10* (2023.01)

(52) U.S. Cl.
CPC .......... *H10B 43/40* (2023.02); *H01L 23/535* (2013.01); *H10B 41/27* (2023.02); *H10B 41/41* (2023.02); *H10B 43/27* (2023.02); *H10B 41/10* (2023.02); *H10B 43/10* (2023.02)

(58) Field of Classification Search
CPC ........ H10B 43/40; H10B 43/27; H10B 41/27; H10B 41/41; H10B 41/10; H10B 43/10; H01L 23/535
See application file for complete search history.

(56) References Cited

U.S. PATENT DOCUMENTS

| 9,881,931 | B2* | 1/2018 | Lee | ................... H10B 43/35 |
| 2016/0225714 | A1* | 8/2016 | Yun | ................... H10B 43/27 |
| 2017/0338241 | A1* | 11/2017 | Lee | ................... H10B 43/50 |
| 2019/0333932 | A1* | 10/2019 | Kim | ................... H10B 43/10 |
| 2020/0185274 | A1* | 6/2020 | Yang | ............. H01L 21/76808 |
| 2021/0313344 | A1* | 10/2021 | Ryu | ................... H10B 43/40 |

(Continued)

FOREIGN PATENT DOCUMENTS

| KR | 1020200009345 A | 1/2020 |
| KR | 1020200069826 A | 6/2020 |

*Primary Examiner* — Patricia D Valenzuela
(74) *Attorney, Agent, or Firm* — WILLIAM PARK & ASSOCIATES LTD.

(57) ABSTRACT

The present technology relates to a semiconductor device and a method of manufacturing the semiconductor device. The semiconductor device includes a first source layer spaced apart from a substrate and overlapping with a cell region of the substrate, a second source layer spaced apart from the substrate and overlapping with a discharge contact region of the substrate, a cell stack including cell interlayer insulating layers and conductive patterns alternately stacked on the first source layer, and a channel structure passing through the cell stack and extending into the first source layer. The channel structure includes an upper channel structure passing through the cell stack and a lower channel structure extending into the first source layer, and a connection portion of the upper channel structure and the lower channel structure has a bottleneck pattern.

10 Claims, 16 Drawing Sheets

(56) References Cited

U.S. PATENT DOCUMENTS

2021/0320115 A1* 10/2021 Wu ..................... H10B 43/27
2021/0391011 A1* 12/2021 Ishida ............... G11C 16/0483
2022/0045096 A1*  2/2022 Ryu ..................... H10B 43/10

* cited by examiner

SEMICONDUCTOR DEVICE AND METHOD OF MANUFACTURING THE SEMICONDUCTOR DEVICE

CROSS-REFERENCE TO RELATED APPLICATION

The present application claims priority under 35 U.S.C. § 119(a) to Korean patent application number 10-2021-0121617, filed on Sep. 13, 2021, in the Korean Intellectual Property Office, the entire disclosure of which is incorporated herein by reference.

BACKGROUND

1. Technical Field

The present disclosure relates to an electronic device, and more particularly, to a semiconductor device and a method of manufacturing the semiconductor device.

2. Related Art

A nonvolatile memory element is a memory element in which stored data is maintained even though power supply is cut off. Recently, as improvement of an integration degree of a two-dimensional nonvolatile memory element that forms a memory cell in a single layer on a substrate has reached a limit, a three-dimensional nonvolatile memory element that vertically stacks memory cells on a substrate has been proposed.

The three-dimensional nonvolatile memory element includes interlayer insulating layers and gate electrodes which are alternately stacked, and channel layers passing through the interlayer insulating layers and the gate electrodes, and memory cells are stacked along the channel layers. Various structures and manufacturing methods have been developed to improve reliability of the nonvolatile memory element having such a three-dimensional structure.

SUMMARY

According to an embodiment of the present disclosure, a semiconductor device may include a first source layer spaced apart from a substrate and overlapping with a cell region of the substrate, a second source layer spaced apart from the substrate and overlapping with a discharge contact region of the substrate, a cell stack including cell interlayer insulating layers and conductive patterns alternately stacked on the first source layer, and a channel structure passing through the cell stack and extending into the first source layer. The channel structure may include an upper channel structure passing through the cell stack and a lower channel structure extending into the first source layer, and a connection portion of the upper channel structure and the lower channel structure has a bottleneck pattern.

According to an embodiment of the present disclosure, a method of manufacturing a semiconductor device may include forming a source layer on a substrate including a cell region and a discharge contact region, forming a contact hole passing through the source layer overlapping the discharge contact region and a plurality of holes passing through the source layer overlapping the cell region, forming a discharge contact by filling the contact hole with a conductive material, and forming a plurality of etch stop patterns by filling the plurality of holes with the conductive material, forming a stack in which a first material layer and a second material layer are alternately stacked on an entire structure including the discharge contact and the plurality of etch stop patterns, and forming a plurality of channel holes passing through the stack, through which the plurality of etch stop patterns are exposed.

According to an embodiment of the present disclosure, a method of manufacturing a semiconductor device may include forming a source layer on a substrate including a cell region and a discharge contact region, forming a contact hole passing through the source layer overlapping the discharge contact region and a plurality of holes passing through the source layer overlapping the cell region, forming a discharge contact by filling the contact hole with a conductive material, and forming a plurality of etch stop patterns by filling the plurality of holes with the conductive material, forming a stack in which a first material layer and a second material layer are alternately stacked on an entire structure including the discharge contact and the plurality of etch stop patterns, forming a plurality of channel holes passing through the stack, through which the plurality of etch stop patterns are exposed, and extending the channel holes into the source layer by removing the plurality of exposed etch stop patterns.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure will be described in detail with reference to the accompanying drawings, so that those skilled in the art to which the present disclosure pertains may carry out the technical spirit of the present disclosure.

An embodiment of the present disclosure provides a semiconductor device and a method of manufacturing the semiconductor device capable of securing a critical dimension of a lower portion of a cell plug.

According to the present technology, in an embodiment, during a discharge contact forming process, an etch stop pattern passing through a source layer of a cell region may be formed together, and the etch stop pattern may be used as an etch stop layer, to perform a channel hole etching process. Therefore, in an embodiment, a critical dimension of a lower end of a channel hole may be secured.

Figure 1:
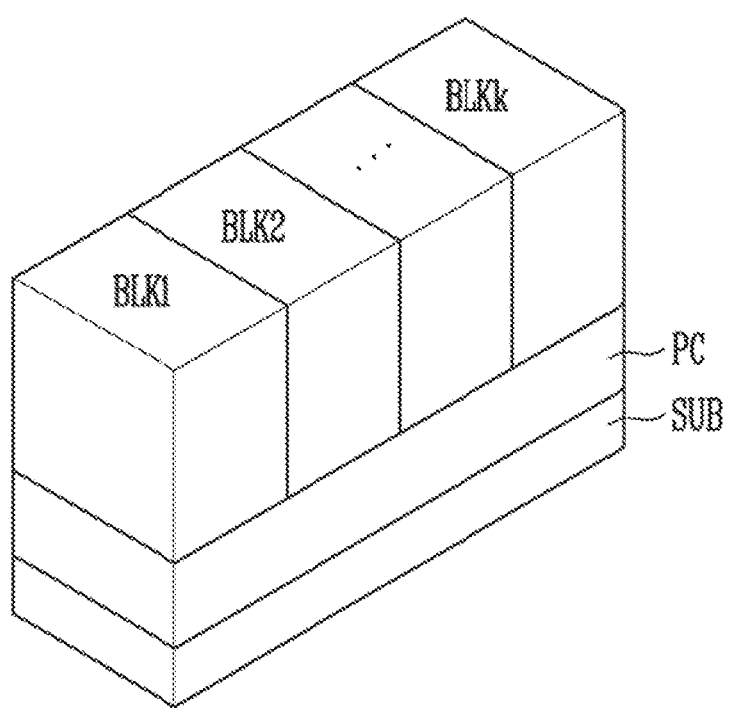
FIG. 1 is a block diagram schematically illustrating a semiconductor device according to an embodiment of the present disclosure.

FIG. 1 is a block diagram schematically illustrating a semiconductor device according to an embodiment of the present disclosure.

Referring to FIG. 1, the semiconductor device may include a peripheral circuit structure PC and memory blocks BLK1 to BLKk (k is a natural number equal to or greater than 2) disposed on a substrate SUB. The memory blocks BLK1 to BLKk may overlap the peripheral circuit structure PC.

The substrate SUB may be a single crystal semiconductor layer. For example, the substrate SUB may be a bulk silicon substrate, a silicon on insulator substrate, a germanium substrate, a germanium on insulator substrate, a silicon-germanium substrate, or an epitaxial thin film formed through a selective epitaxial growth method.

The peripheral circuit structure PC may include a row decoder, a column decoder, a page buffer, a control circuit, and the like which configure a circuit for controlling an operation of the memory blocks BLK1 to BLKk. For example, the peripheral circuit structure PC may include an NMOS transistor, a PMOS transistor, a resistor, a capacitor, and the like electrically connected to the memory blocks BLK1 to BLKk. The peripheral circuit structure PC may be disposed between the substrate SUB and the memory blocks BLK1 to BLKk. However, the present disclosure does not exclude an embodiment in which the peripheral circuit structure PC extends to another region of the substrate SUB that is not overlapping the memory blocks BLK1 to BLKk.

Each of the memory blocks BLK1 to BLKk may include impurity doped regions, bit lines, cell strings electrically connected to the impurity doped regions and bit lines, word lines electrically connected to the cell strings, and select lines electrically connected to the cell strings. Each of the cell strings may include memory cells and select transistors connected in series by a channel structure. Each of the select lines is used as a gate electrode of a select transistor corresponding to the select line, and each of the word lines is used as a gate electrode of a memory cell corresponding to the word line.

Figure 2:
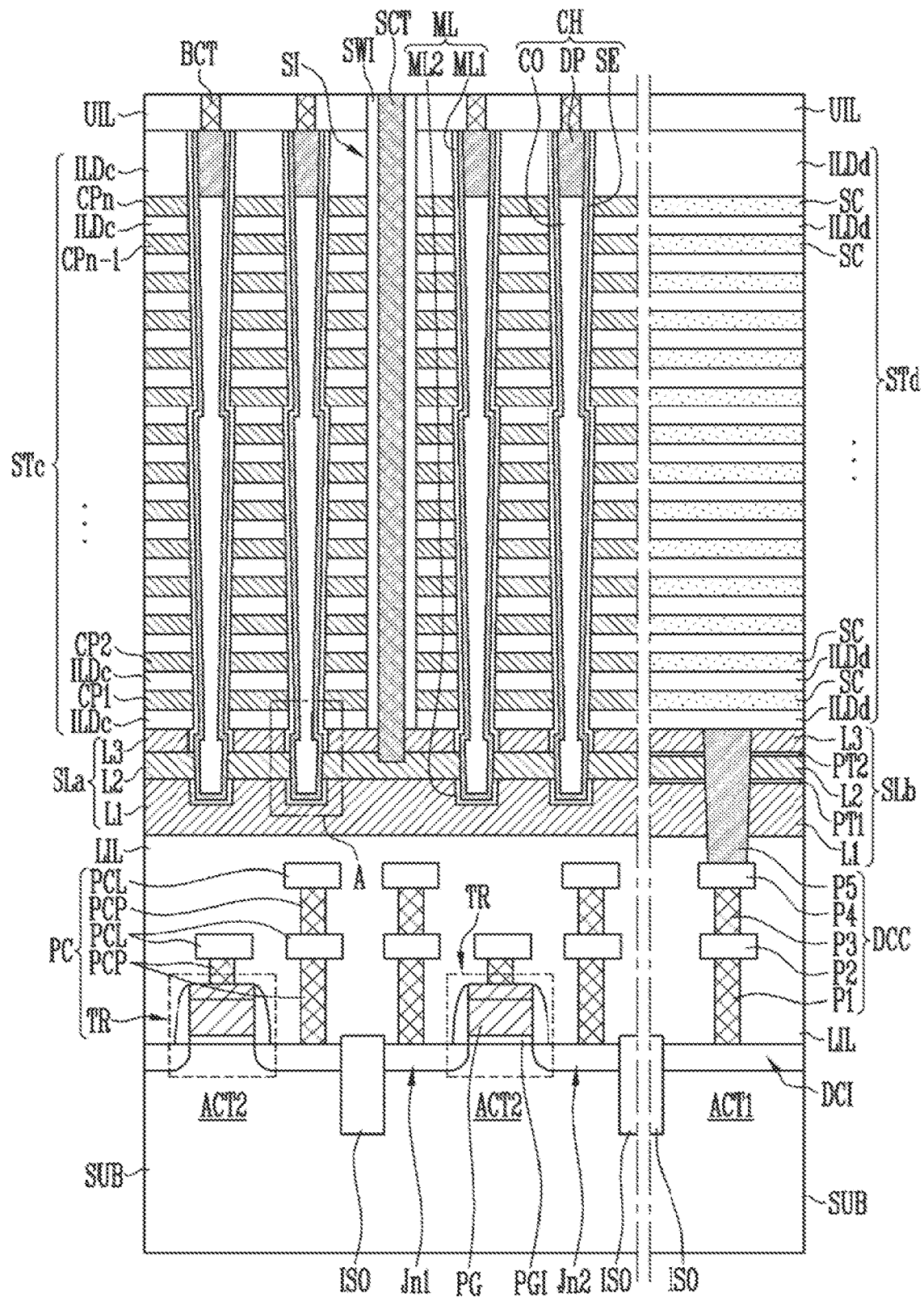
FIG. 2 is a cross-sectional view illustrating a semiconductor device according to embodiments of the present disclosure.

FIG. 2 is a cross-sectional view illustrating a semiconductor device according to embodiments of the present disclosure.

Referring to FIG. 2, the semiconductor memory devices may include source layers SLa and SLb disposed on a substrate SUB, a cell stack STc disposed on the source layer SLa, a dummy stack STd disposed on the source layer SLb, and a conductive contact plug DCC extending downward by passing through one region of the source layer SLb overlapping the dummy stack STd.

The substrate SUB may be formed of the same material as the substrate SUB described above with reference to FIG. 1. Conductive dopants defining a well region may be implanted into the substrate SUB. The conductive dopant defining the well region may be an n-type or p-type impurity. The well region of the substrate SUB may be divided into active regions ACT1 and ACT2 divided by element isolation layers ISO. The element isolation layers ISO may include an insulating material buried in the substrate SUB. The active regions ACT1 and ACT2 may include a first active region ACT1 overlapping the conductive contact plug DCC and one or more second active regions ACT2 overlapping the cell stack STc.

The source layers SLa and SLb may be disposed to be spaced apart from the substrate SUB by the peripheral circuit structure PC and a lower insulating structure LIL.

The peripheral circuit structure PC may include a transistor TR as described above with reference to FIG. 1. The transistor TR may include a peripheral-gate insulating layer PGI disposed on the second active region ACT2, a peripheral-gate electrode PG disposed on the peripheral-gate insulating layer PGI, and first and second junctions Jn1 and Jn2 disposed in the second active region ACT2 on both sides of the peripheral-gate gate electrode PG. The first and second junctions Jn1 and Jn2 are regions defined by implanting an n-type or p-type impurity into the second active region ACT2, and one of the first and second junctions Jn1 and Jn2 may be used as a source junction and the other may be used as a drain junction.

The peripheral circuit structure PC may include connection lines PCL and peripheral-contact plugs PCP connected to the transistor TR. The peripheral circuit structure PC may include the resistor, the capacitor, and the like as described with reference to FIG. 1, in addition to the transistor TR, and the connection lines PCL and the peripheral-contact plugs PCP that connects the transistor TR to the connection lines PCL.

A conductive impurity may be implanted into the first active region ACT1. As an embodiment, a discharge impurity region DCI may be defined in the first active region ACT1. The discharge impurity region DCI may include conductive impurities forming a PN diode. The discharge impurity region DCI may be used as a path for discharging a charge accumulated in the source layers SLa and SLb.

The above-described peripheral circuit structure PC may be covered with the lower insulating structure LIL disposed between the source layers SLa and SLb and the substrate SUB. The lower insulating structure LIL may extend to cover the discharge impurity region DCI. The lower insulation structure LIL may include insulating layers stacked in multiple layers.

The source layers SLa and SLb may be disposed on the lower insulating structure LIL. The source layers SLa and SLb may include two or more semiconductor layers L1, L2, and L3.

For example, the source layer SLa may include first to third semiconductor layers L1 to L3 sequentially stacked on the lower insulating structure LIL. Each of the first and second semiconductor layers L1 and L2 may be a doped semiconductor layer including a source dopant. As an embodiment, each of the first and second semiconductor layers L1 and L2 may include a doped silicon layer including an n-type impurity. The third semiconductor layer L3 may be omitted in some cases. The third semiconductor layer L3 may include at least one of an n-type doped silicon layer and an un-doped silicon layer.

For example, the source layer SLb may include the first to third semiconductor layers L1 to L3 and protective layers PT1 and PT2 stacked between the first to third semiconductor layers L1 to L3. The protective layers PT1 and PT2 may include an oxide layer. The second semiconductor layer L2 included in the source layer SLb may be replaced with a sacrificial layer.

The first semiconductor layer L1 and the third semiconductor layer L3 of the source layer SLa are electrically connected to the first semiconductor layer L1 and the third semiconductor layer L3 of the source layer SLb.

The source layer SLb is penetrated by the conductive contact plug DCC. The conductive contact plug DCC may pass through the lower insulating structure LIL to be in contact with the discharge impurity region DCI of the substrate SUB. The conductive contact plug DCC may be in direct contact with the discharge impurity region DCI and the source layer SLb. The source layer SLb and the discharge impurity region DCI may be connected to each other by the conductive contact plug DCC. Therefore, a charge accumulated in the source layers Sla and SLb may be discharged to the substrate SUB through the discharge impurity region DCI via the conductive contact plug DCC.

The conductive contact plug DCC may include first to fifth patterns P1 to P5 that are sequentially stacked. The first pattern P1 and the third pattern P3 may be disposed in the lower insulation structure LIL and may be disposed respective levels on the peripheral-contact plugs PCP are disposed. The second pattern P2 and the fourth pattern P4 may be disposed in the lower insulating structure LIL and may be disposed respective levels on which the connection wires PCL are disposed. The fifth pattern P5 may pass through the source layer SLb and may extend into the lower insulating structure LIL to be in contact with the fourth pattern P4.

The dummy stack STd may overlap the conductive contact plug DCC. The dummy stack STd may extend to cover a first region of the source layer SLb overlapping the discharge impurity region DCI and the conductive contact plug DCC. The dummy stack STd may include dummy interlayer insulating layers ILDd and sacrificial insulating layers SC that are alternately stacked on the first region of the source layer SLb and the conductive contact plug DCC.

The cell stack STc may include cell interlayer insulating layers ILDc and conductive patterns CP1 to CPn (n is a natural number equal to or greater than 2) that are alternately stacked on a second region of the source layer SLa. The cell stack STc may be disposed so as not to overlap the conductive contact plug DCC. The cell stack STc may be disposed on the same level as the dummy stack STd. The cell interlayer insulating layers ILDc may be disposed on the same level as the dummy interlayer insulating layers ILDd and the conductive patterns CP1 to CPn may be disposed on the same level as the sacrificial insulating layers SC.

The cell interlayer insulating layers ILDc and the dummy interlayer insulating layers ILDd may be formed of the same material and may be formed through the same process. The sacrificial insulating layers SC may be formed of a material having an etching rate different from that of the cell interlayer insulating layers ILDc and the dummy interlayer insulating layers ILDd. For example, the cell interlayer insulating layers ILDc and the dummy interlayer insulating layers ILDd may include silicon oxide, and the sacrificial insulating layers SC may include silicon nitride.

Each of the conductive patterns CP1 to CPn may include various conductive materials such as a doped silicon layer, a metal layer, a metal silicide layer, and a barrier layer, and may include two or more types of conductive materials. For example, each of the conductive patterns CP1 to CPn may include tungsten and a titanium nitride layer (TiN) surrounding a surface of tungsten. The tungsten is a low resistance metal, and may reduce a resistance of the conductive patterns CP1 to CPn. The titanium nitride layer (TiN) is a barrier layer and may prevent direct contact between the tungsten and the cell interlayer insulating layers ILDc.

The conductive patterns CP1 to CPn may be used as gate electrodes of the cell string. The gate electrodes of the cell string may include source select lines, word lines, and drain select lines. The source select lines are used as gate electrodes of the source select transistors, the drain select lines are used as gate electrodes of the drain select transistors, and the word lines are used as gate electrodes of the memory cells.

The cell stack STc may surround a channel structure CH. That is, the channel structure CH may pass through a portion of the cell stack STc and the source layer SLa. The channel structure CH may include a channel semiconductor pattern SE. The channel semiconductor pattern SE may include a silicon layer. A central region of the channel semiconductor pattern SE may be filled with a core insulating layer CO. The core insulating layer CO may be formed at a height lower than that of the channel semiconductor pattern SE. An upper central region of the channel semiconductor pattern SE extending over the core insulating layer CO may be filled with a doped semiconductor pattern DP disposed on the core insulating layer CO. The doped semiconductor pattern DP may include an n-type doped silicon layer. The channel semiconductor pattern SE of the channel structure CH may be used as a channel region of the cell string, and the doped semiconductor pattern DP of the channel structure CH may be used as the drain junction of the cell string. A sidewall of the channel structure CH may be surrounded by a memory layer ML.

The channel structure CH may pass through the cell stack STc and extend into the source layer SLa. The sidewall of the channel structure CH overlapping the source layer SLa may be in direct contact with the source layer SLa. As an embodiment, the second semiconductor layer L2 of the source layer SLa may be in direct contact with a sidewall of the channel semiconductor pattern SE overlapping the second semiconductor layer L2. In this case, the memory layer ML may be divided into a first memory pattern ML1 and a second memory pattern ML2 by the second semiconductor layer L2. The first memory pattern ML1 may be disposed between the channel structure CH and the cell stack STc and may extend between the channel structure CH and the third semiconductor layer L3. The second memory pattern ML2 may be disposed between the channel structure CH and the first semiconductor layer L1.

A portion of the channel structure CH extending into the source layer SLa may be defined as a lower channel structure, and a portion of the channel structure CH passing through the cell stack STc may be defined as an upper channel structure. The uppermost portion of the lower channel structure and the lowermost surface of the upper channel structure may be in contact with each other, and a critical dimension of the uppermost surface of the lower channel structure may be greater than a critical dimension of the lowermost surface of the upper channel structure.

A region A is a boundary portion between the lower channel structure and the upper channel structure of the channel structure CH. A connection portion between the lower channel structure and the upper channel structure is described below with reference to FIG. 3 to be described later.

A slit SI may be filled with a source contact structure SCT. The source contact structure SCT may be spaced apart from the cell stack STc by a sidewall insulating layer SWI formed on the sidewall. The sidewall insulation layer SWI may be penetrated by the source contact structure SCT. The source contact structure SCT may extend to be in contact with the source layer SLa. The source contact structure SCT may include a single conductive material or two or more types of conductive materials. The conductive material for the source contact structure SCT may include a doped silicon layer, a metal layer, a metal silicide layer, a barrier layer, and the like. For example, the source contact structure SCT may include a doped silicon layer that is in contact with the source layer Sla or SLb and a metal layer disposed on the doped silicon layer.

The upper insulating structure UIL may include a single insulating layer or two or more insulating layers. For example, the upper insulating structure UIL may include an oxide layer. The upper insulating structure UIL may be penetrated by a bit line contact plug BCT. The bit line contact plug BCT may be connected to the doped semiconductor pattern DP of the channel structure CH.

Figure 3:
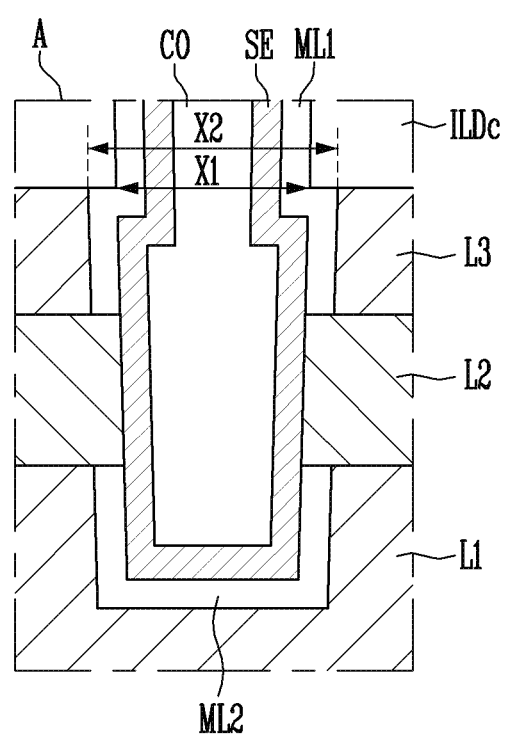
FIG. 3 is an enlarged cross-sectional view of A region of FIG. 2.

FIG. 3 is an enlarged cross-sectional view of the A region of FIG. 2.

Referring to FIG. 3, each critical dimension may be different from each other in the connection portion of the lower channel structure and the upper channel structure. For example, in the lower channel structure, a critical dimension X2 of the uppermost end connected to the upper channel structure may be greater than a critical dimension X1 of the lowermost end of the upper channel structure. That is, in an embodiment, the connection portion of the lower channel structure and the upper channel structure may have a bottleneck pattern.

FIGS. 4A to 4J are cross-sectional views illustrating a method of manufacturing a semiconductor device according to an embodiment of the present disclosure.

Figure 4A:
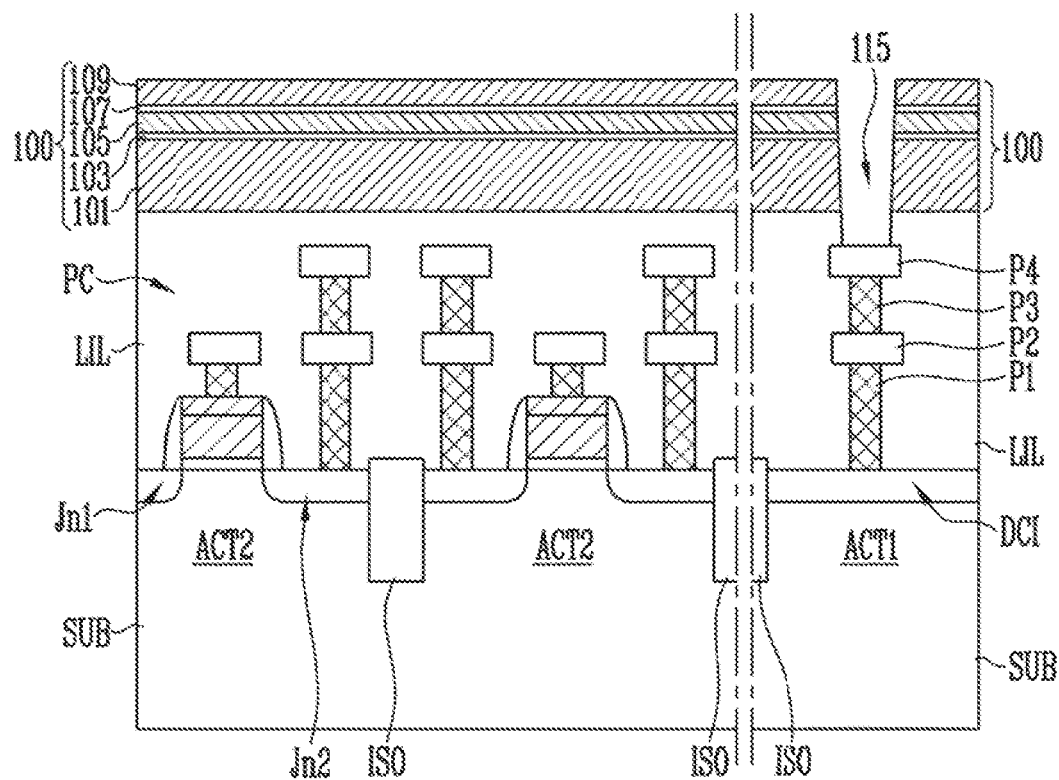
FIGS. 4A, 4B, 4C, 4D, 4E, 4F, 4G, 4H, 4I, and 4J are cross-sectional views illustrating a method of manufacturing a semiconductor device according to an embodiment of the present disclosure.

Referring to FIG. 4A, the peripheral circuit structure PC and the first to fourth patterns P1 to P4 may be formed on the substrate SUB including the active regions ACT1 and ACT2 partitioned by the element isolation layers ISO. The peripheral circuit structure PC and the first to fourth patterns P1 to P4 may be covered with the lower insulation structure LIL.

The active regions ACT1 and ACT2 may include the first active region ACT1 and the second active region ACT2. The first active region ACT1 may include the discharge impurity region DCI and the second active region ACT2 may include the junctions Jn1 and Jn2. A region overlapping the first active region ACT1 may be defined as the discharge contact region, and a region overlapping the second active area ACT2 may be defined as the cell region.

Since the element isolation layers ISO, the active regions ACT1 and ACT2, the discharge impurity region DCI, the junctions Jn1 and Jn2, the peripheral circuit structure PC, and the lower insulating structure LIL are specifically described with reference to FIGS. 1 and 2, repetitive description thereof is omitted.

The first to fourth patterns P1 to P4 may be formed of a conductive material and may be sequentially stacked on the discharge impurity region DCI. The first pattern P1 disposed on the lowermost layer among the first to fourth patterns P1 to P4 may be in direct contact with the discharge impurity region DCI.

Subsequently, a lower stack 100 may be formed on the lower insulation structure LIL. The lower stack 100 may include a lower semiconductor layer 101, a sacrificial layer 105, and an upper semiconductor layer 109 which are sequentially stacked. A first protective layer 103 may be formed on the lower semiconductor layer 101 before the sacrificial layer 105 is deposited on the lower semiconductor layer 101. A second protective layer 107 may be formed on the lower semiconductor layer 101 or the first protective layer 103 before the upper semiconductor layer 109 is formed on the lower semiconductor layer 101 or the first protective layer 103.

The lower semiconductor layer 101 may include a doped semiconductor layer including a conductive impurity. For example, the lower semiconductor layer 101 may include an n-type doped silicon layer. The sacrificial layer 105 may include a material having an etching rate different from that of the first protective layer 103 and the second protective layer 107. Each of the first protective layer 103 and the second protective layer 107 may include a material having an etching rate different from that of the lower semiconductor layer 101 and the upper semiconductor layer 109. For example, the sacrificial layer 105 may include an un-doped silicon layer, and each of the first protective layer 103 and the second protective layer 107 may include an oxide layer. The upper semiconductor layer 109 may include a semiconductor layer. For example, the upper semiconductor layer 109 may include a doped silicon layer or an un-doped silicon layer.

Subsequently, an opening portion 115 passing through a portion of the lower stack 100 overlapping the discharge impurity region DCI to expose the lower insulation structure LIL may be formed. The opening portion 115 may extend into the lower insulating structure LIL at a predetermined depth. The opening portion 115 may expose the fourth pattern P4 disposed on the uppermost layer among the first to fourth patterns P1 to P4.

Figure 4B:
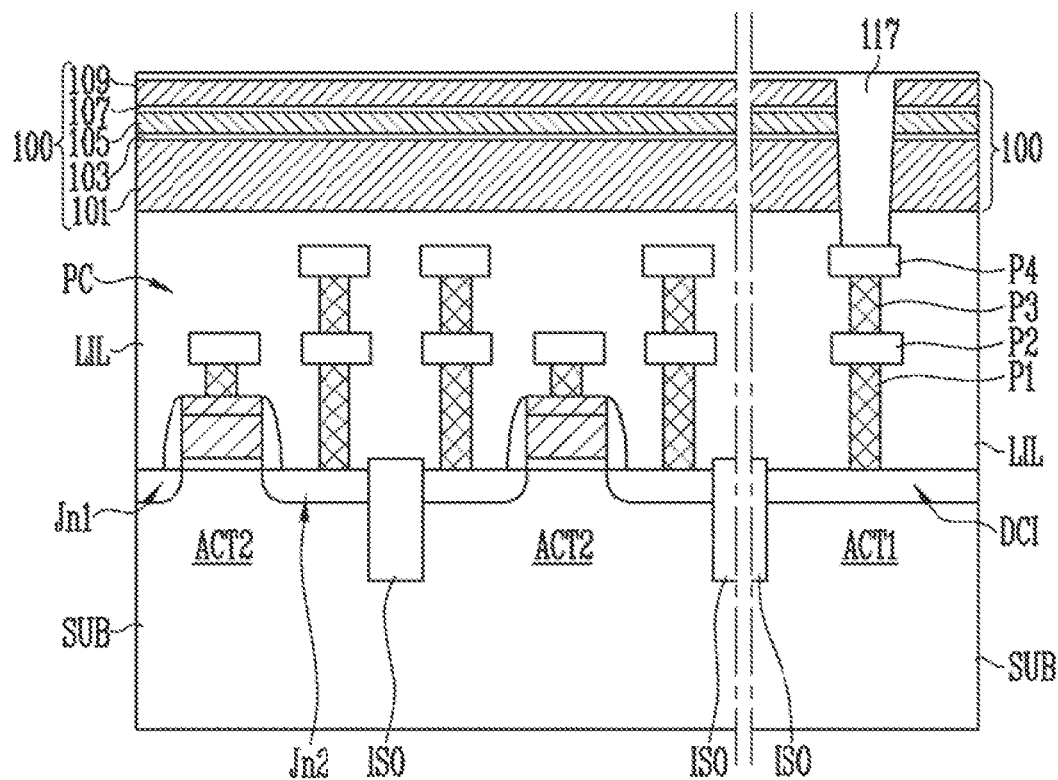

Referring to FIG. 4B, a buffer layer 117 may be formed to completely fill the opening portion 115 of FIG. 4A. The buffer layer 117 may be formed of an oxide layer having an etching rate similar to that of the lower insulating structure LIL.

Figure 4C:
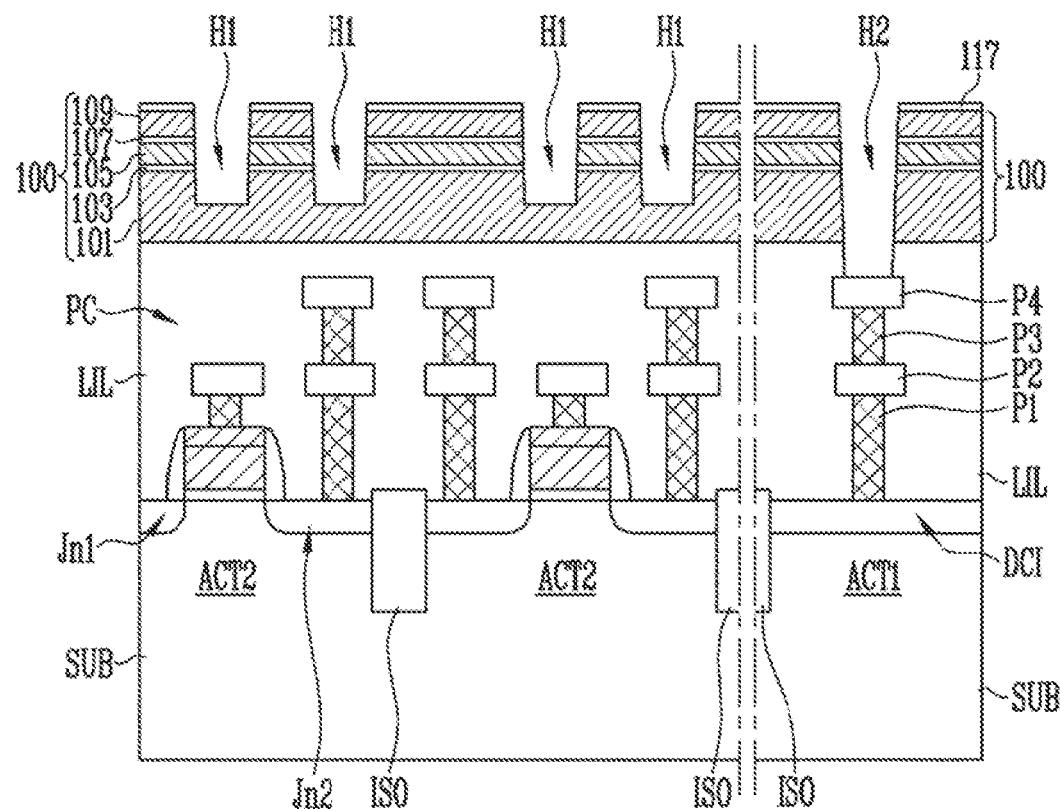

Referring to FIG. 4C, the buffer layer 117 and the lower stack 100 are etched to form a contact hole H2 so that a portion of the fourth pattern P4 is exposed. A critical dimension of the contact hole H2 may be greater than a critical dimension of the opening portion 115 of FIG. 4A. That is, the contact hole H2 may be formed by etching the buffer layer 117 buried in the opening portion 115 of FIG. 4A and a sidewall of the opening portion 115 by a predetermined width.

Referring to FIG. 4B, a buffer layer 117 may be formed to completely fill the opening 115 of FIG. 4A. The buffer layer 117 may be formed of an oxide layer having an etching rate similar to that of the lower insulating structure LIL.

Referring to FIG. 4C, the buffer layer 117 and the lower stack 100 are etched to form a contact hole H2 so that a portion of the fourth pattern P4 is exposed. A critical dimension of the contact hole H2 may be greater than a critical dimension of the opening 115 of FIG. 4A. That is, the contact hole H2 may be formed by etching the buffer layer 117 buried in the opening 115 of FIG. 4A and a sidewall of the opening 115 by a predetermined width.

During the etching process for forming the contact hole H2 described above, a plurality of holes H1 are formed by etching the lower stack 100 of a region where the cell plugs are formed in the cell region. The plurality of holes H1 may be formed together during the etching process for forming the contact hole H2. The plurality of holes H1 may be formed to pass through the buffer layer 117, the upper semiconductor layer 109, the second protective layer 107, and the sacrificial layer 105. The plurality of holes H1 may be formed to extend into the first protective layer 103 and the lower semiconductor layer 101.

Figure 4D:
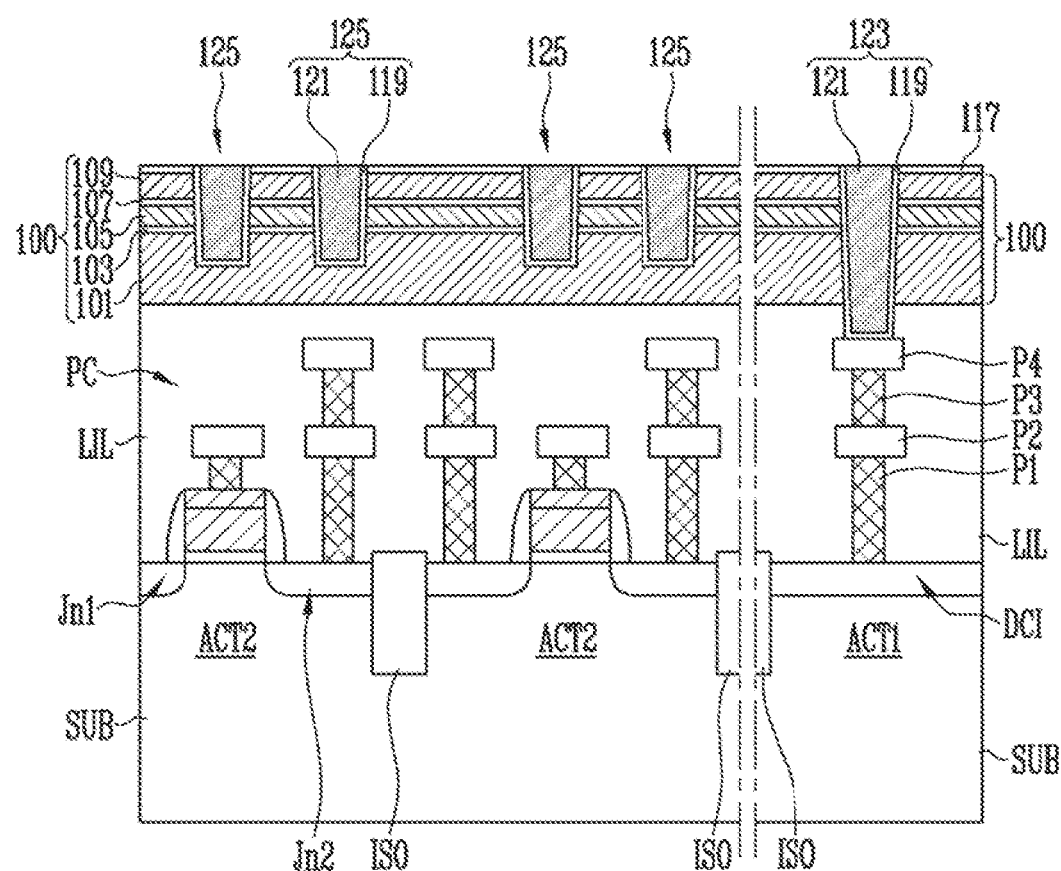

Referring to FIG. 4D, a conductive pattern 123 may be formed to fill the contact hole H2 of FIG. 4C. The conductive pattern 123 may include a first conductive layer 119 formed along a lower surface and a sidewall of the contact hole H2 and a second conductive layer 121 filling an inside of the contact hole H2. The first conductive layer 119 may be a diffusion prevention layer. The first conductive layer 119 and the second conductive layer 121 may be formed of a metal layer. The conductive pattern 123 is directly connected to the upper semiconductor layer 109, the lower semiconductor layer 101, and the fourth pattern P4. Accordingly, the first to fourth patterns P1 to P4 and the conductive pattern 123 may configure the conductive contact plug connected to the discharge impurity region DCI.

During a process of forming the conductive pattern 123, the first conductive layer 119 and the second conductive layer 121 are filled in the plurality of holes H1 of FIG. 4C to form an etch stop pattern 125.

In order to form the conductive pattern 123 and the etch stop pattern 125, the first conductive layer 119 and the second conductive layer 121 may be sequentially stacked to fill the contact hole H2 and the plurality of holes H1, and a planarization process may be performed so that the buffer layer 117 is exposed. The planarization process may include a chemical mechanical polishing (CMP) process. The planarization process may be performed so that first and second conductive layers outside the contact hole H2 and the plurality of holes H1 are removed.

Figure 4E:
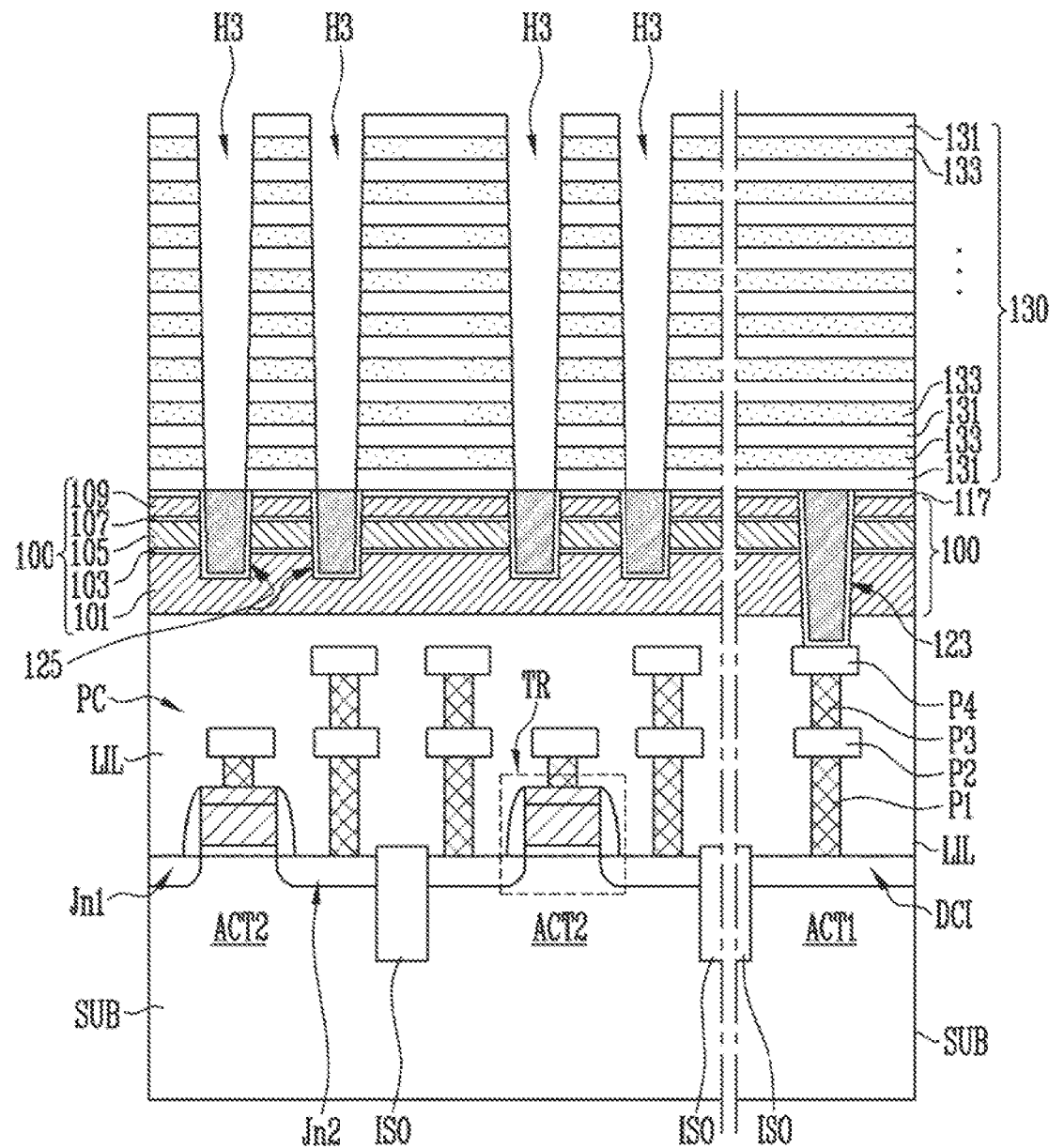

Referring to FIG. 4E, a first upper stack 130 may be formed on the buffer layer 117. The first upper stack 130 may include first material layers 131 and second material layers 133 which are alternately stacked. The first material layers 131 and the second material layers 133 extend to overlap the conductive pattern 123 and the etch stop pattern 125.

The first material layers 131 may include a material different from that of the second material layers 133. As an embodiment, the first material layers 131 may include an insulating material, and the second material layers 133 may include a sacrificial insulating material having an etching rate different from that of the first material layers 131. For example, each of the first material layers 131 may include silicon oxide, and each of the second material layers 133 may include silicon nitride.

Thereafter, first channel holes H3 passing through the first upper stack 130 to expose the etch stop patterns 125 are formed. During an etching process of the first upper stack 130 for forming the first channel holes H3, the first channel holes H3 may be prevented from passing through the lower stack 100 by the etch stop pattern 125. In addition, the first upper stack 130 may be etched so that a critical dimension of a bottom surface of the first channel holes H3 is sufficiently secured, by using the etch stop pattern 125 during the etching process of the first upper stack 130.

Figure 4F:
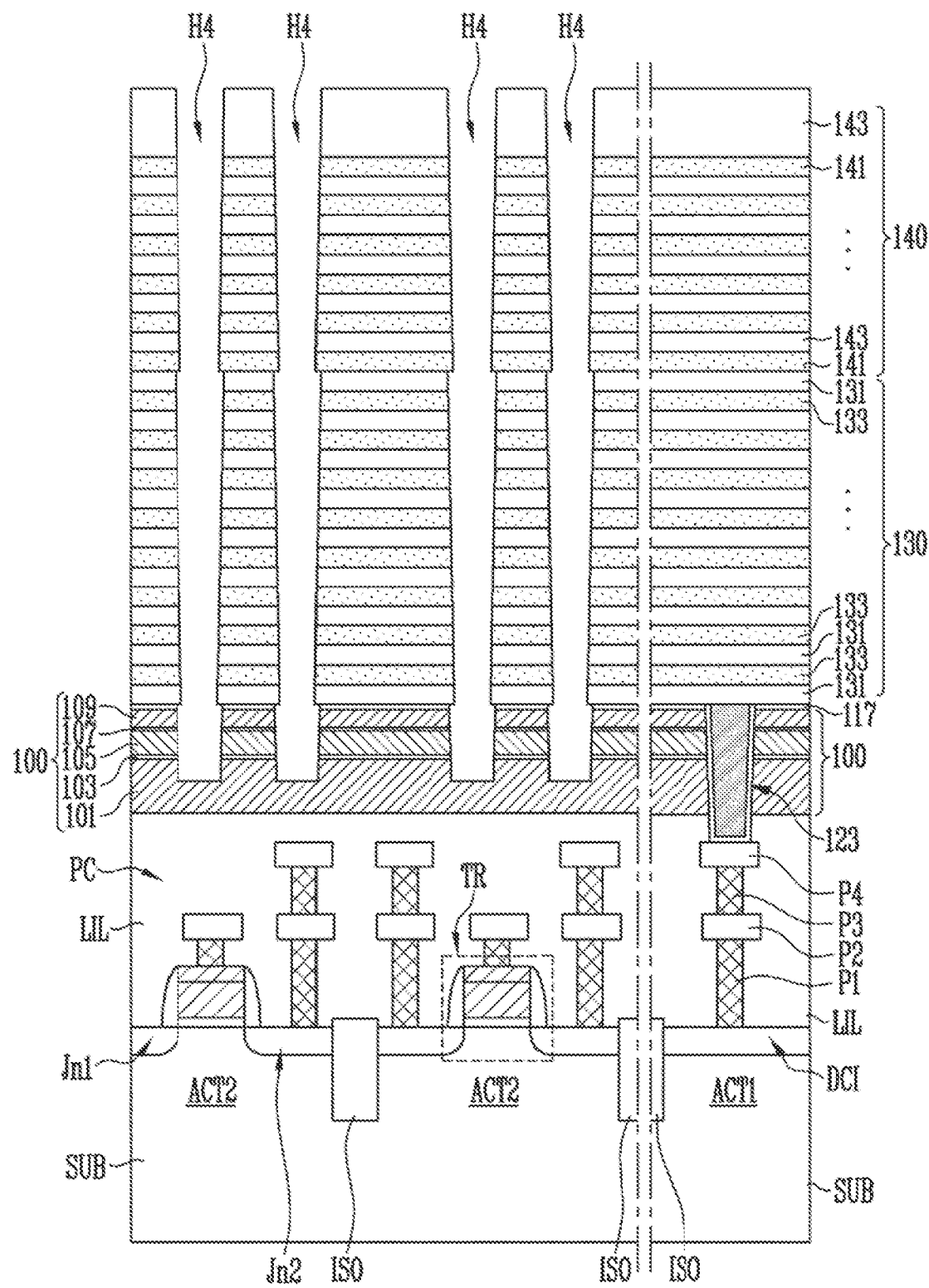

Referring to FIG. 4F, after filling the first channel holes H3 of FIG. 4E with a sacrificial layer, a second upper stack 140 may be formed on the first upper stack 130. The second upper stack 140 may include first material layers 143 and second material layers 141 which are alternately stacked.

The first material layers 143 may include a material different from that of the second material layers 141. As an embodiment, the first material layers 143 may include an insulating material, and the second material layers 141 may include a sacrificial insulating material having an etching rate different from that of the first material layers 143. For example, each of the first material layers 143 may include silicon oxide, and each of the second material layers 141 may include silicon nitride. The first material layer 143 of the second upper stack 140 may be the same material as the first material layer 131 of the first upper stack 130, and the second material layer 141 of the second upper stack 140 may be the same material as the first material layer 143 of the first upper stack 130.

Thereafter, second channel holes H4 passing through the second upper stack 140 to expose the sacrificial layer that fills the first channel holes H3 of FIG. 4E are formed. Thereafter, the sacrificial layer and the etch stop patterns 125 of FIG. 4E are removed. Accordingly, the second channel holes H4 extend into the first upper stack 130 and the lower stack 100. The second channel holes H4 have a bottleneck pattern at the boundary portion between the first upper stack 130 and the lower stack 100.

Figure 4G:
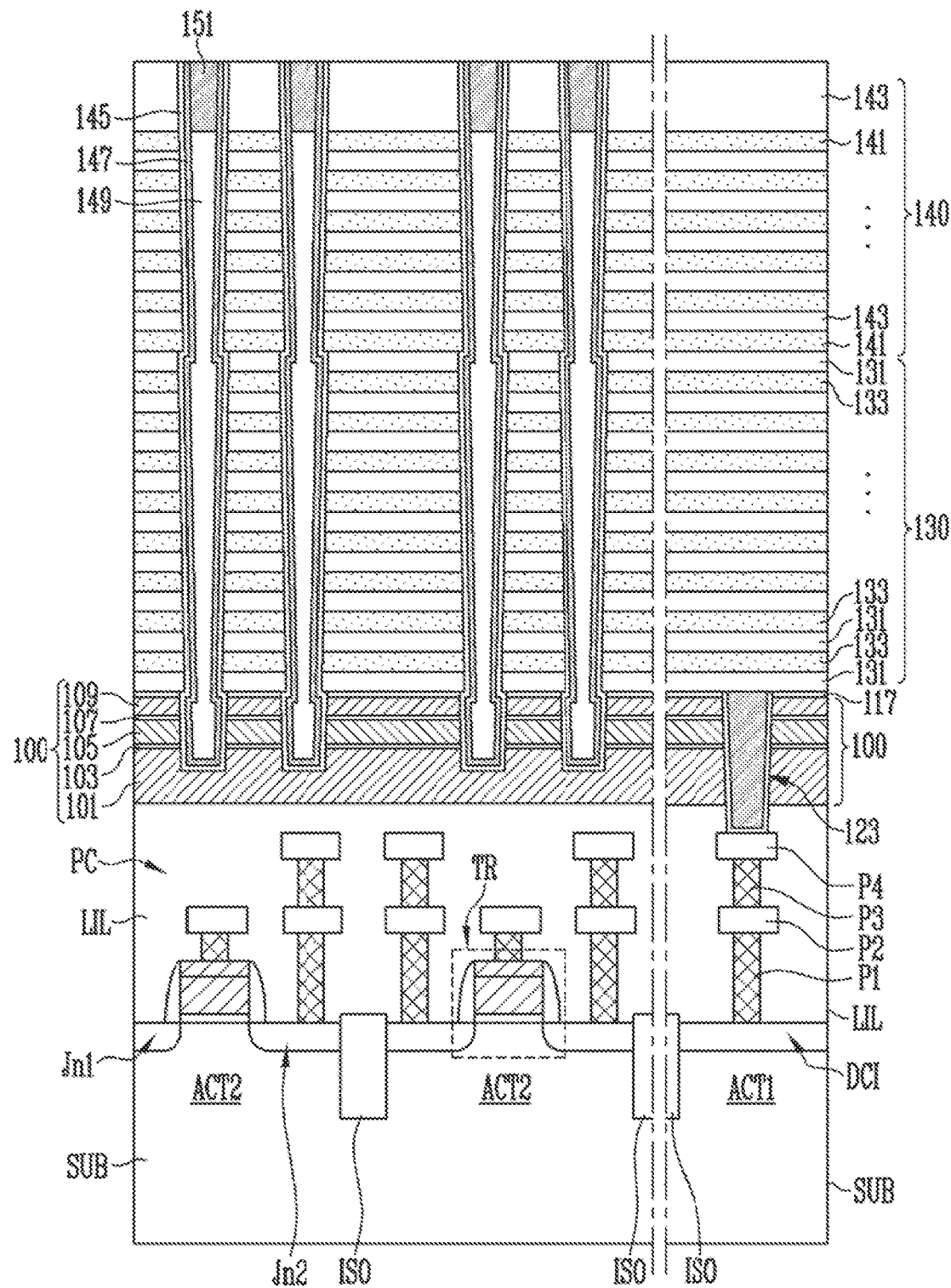

Referring to FIG. 4G, a memory layer 145 may be conformally formed on a surface of the second channel holes H4 of FIG. 4F. The memory layer 145 may include a tunnel insulating layer, a data storage layer, and a blocking insulating layer.

A channel semiconductor pattern 147 may be formed in a central region of the second channel holes opened by the memory layer 145. The channel semiconductor pattern 147 may be formed in a pillar shape fill the central region of the second channel holes opened by the memory layer 145. Alternatively, the channel semiconductor pattern 147 may be conformally formed along a surface of the memory layer 145, and the central region of the second channel holes may be opened by the channel semiconductor pattern 147. The central region of the second channel holes opened by the channel semiconductor pattern 147 may be filled with a core insulating layer 149. The core insulating layer 149 may be formed to have a height lower than that of the channel semiconductor pattern 147 and the second channel holes. In this case, a doped semiconductor pattern 151 may be formed on the core insulating layer 149. The doped semiconductor pattern 151 may be surrounded by an upper end of the channel semiconductor pattern 147 extending longer than the core insulating layer 149.

The channel semiconductor pattern 147 may include a silicon layer. The doped semiconductor pattern 151 may include an n-type doped silicon layer. The core insulating layer 149 may include an oxide.

Figure 4H:
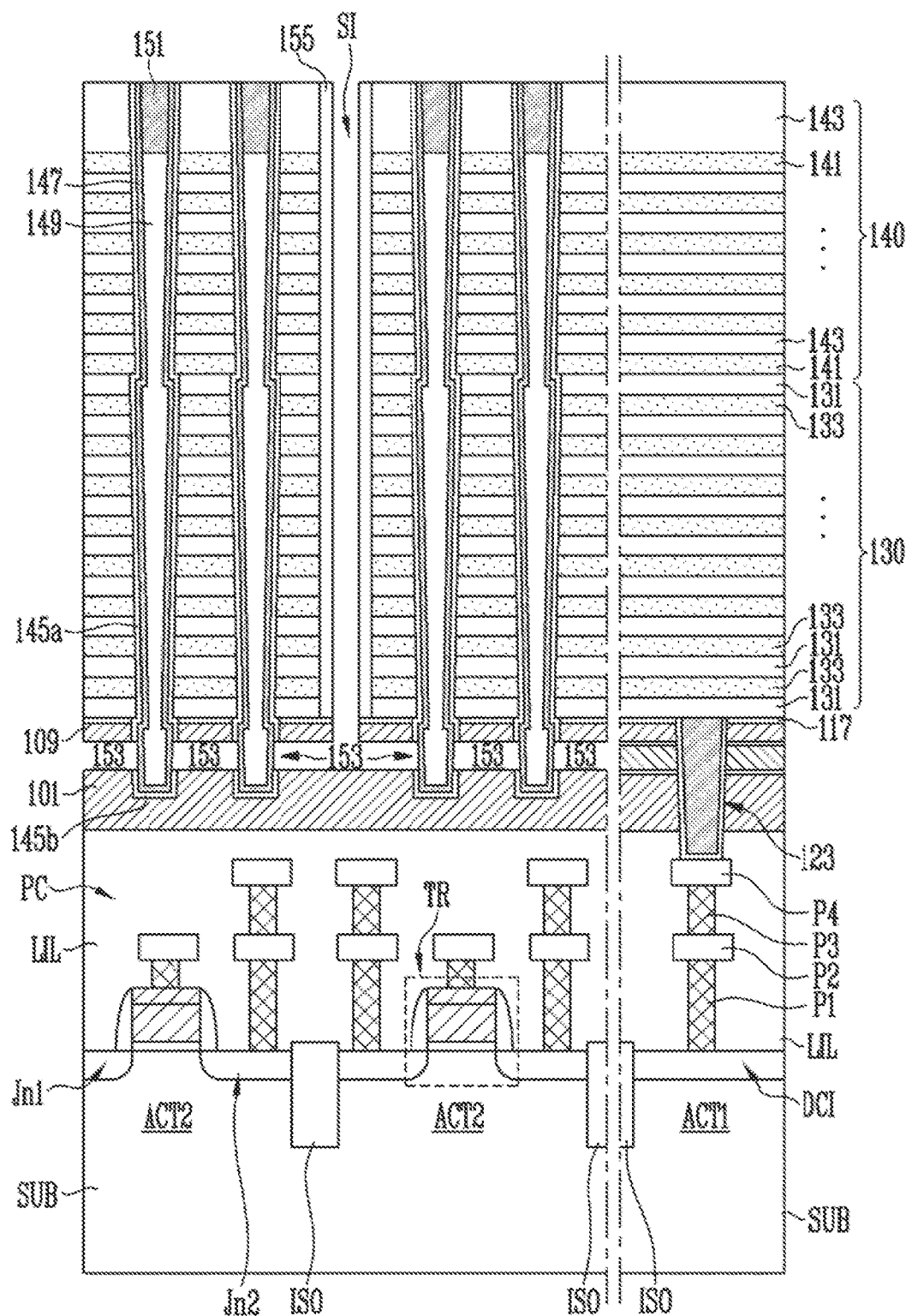

Referring to FIG. 4H, the slit SI passing through the second upper stack 140 and the first upper stack 130 formed on the cell region is formed, and a sidewall insulating layer 155 is formed on a sidewall of the slit SI. The sidewall insulating layer 155 may be formed to expose a bottom surface of the slit SI. The buffer layer 117 may be exposed through the bottom surface of the slit SI exposed by the sidewall insulating layer 155.

Thereafter, the buffer layer 117, the upper semiconductor layer 109, and the second protective layer 107 exposed through the slit SI are etched to expose the sacrificial layer 105 on the cell region.

Thereafter, the exposed sacrificial layer 105 is removed to form a horizontal space 153. At this time, the sacrificial layer 105 on the discharge contact region is not removed and remains. During a process of removing the sacrificial layer 105 on the cell region, the first protective layer and the second protective layer of the cell region may prevent loss of the upper semiconductor layer 109 and the lower semiconductor layer 101.

Thereafter, a portion of the memory layer exposed through the horizontal space 153 is etched to expose the channel semiconductor pattern 147. The memory layer may be separated into a first memory pattern 145a and a second memory pattern 145b by an etching process.

During an etching process of the memory layer, the first protective layer and the second protective layer of the cell region may be removed together.

Figure 4I:
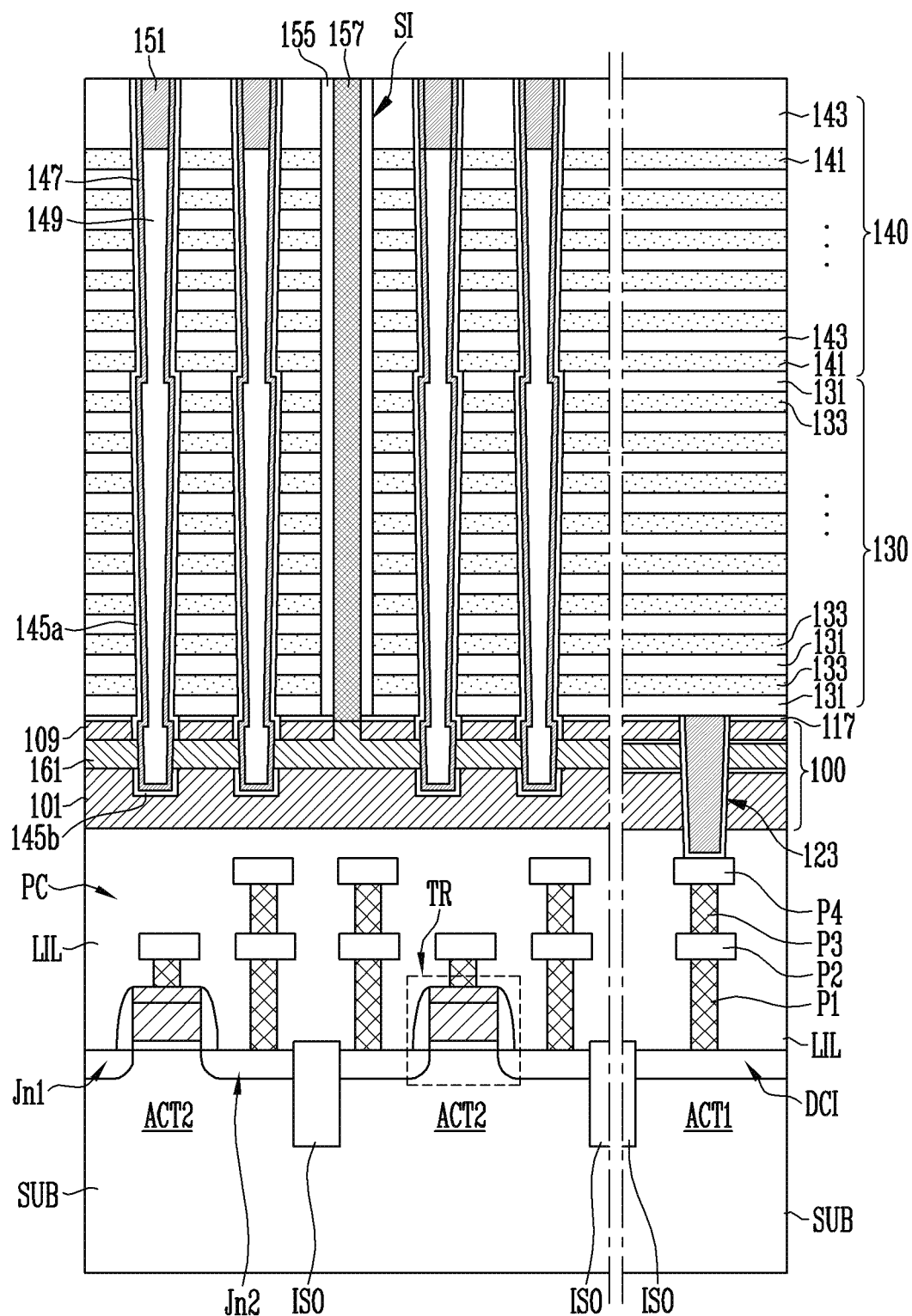

Referring to FIG. 4I, a source semiconductor layer 161 is formed by introducing a conductive material into the horizontal space 153 of FIG. 4H through the slit SI. The source semiconductor layer 161 may be in contact with each of a sidewall of the channel semiconductor layer 147, the lower semiconductor layer 101, and the upper semiconductor layer 109. The source semiconductor layer 161 may be formed using a chemical vapor deposition method, or may be formed using a growth method using each of the channel semiconductor layer 147, the lower semiconductor layer 101, and the upper semiconductor layer 109 as a seed layer. The source semiconductor layer 161 may include a conductive dopant. For example, the source semiconductor layer 161 may include an n-type doped silicon layer. The conductivity dopant in the source semiconductor layer 161 may be diffused into the upper semiconductor layer 109 and the channel semiconductor layer 145 in contact with the source semiconductor layer 161 by heat.

Thereafter, an inside of the slit SI may be filled with a conductive material to form a source contact structure 157 contacting the source semiconductor layer 161 and extending onto the sidewall insulating layer 155.

Figure 4J:
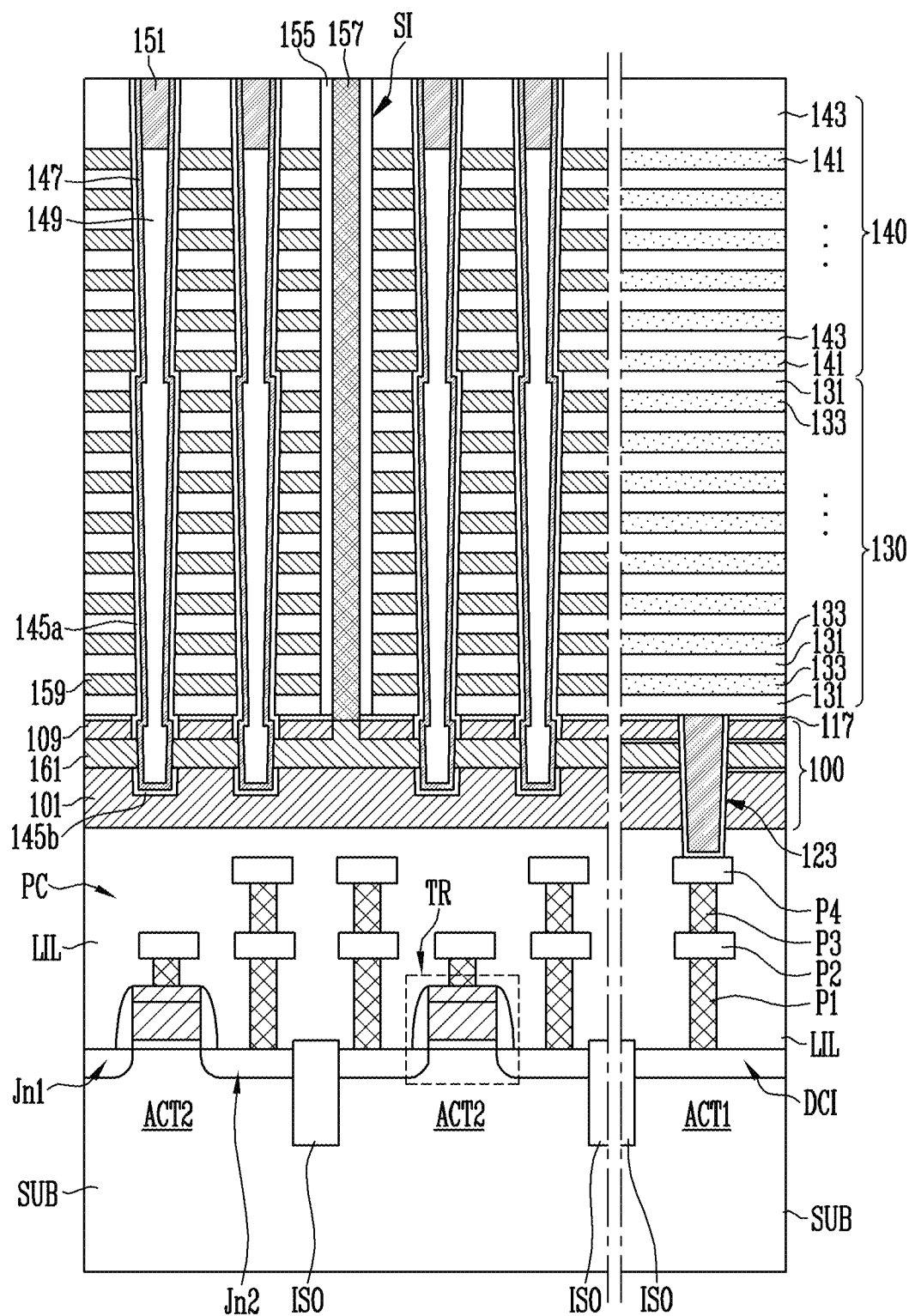

Referring to FIG. 4J, an etching process is performed so that a sidewall of the first upper stack 130 and the second upper stack 140 stacked on the cell region is exposed, and a second material layer of the first upper stack 130 and a second material layer of the second upper stack 140 exposed through the etching process are removed. Thereafter, a conductive material is filled in spaces from which the second material layer of the first upper stack 130 and the second material layer of the second upper stack 140 are removed to form gate patterns 159 for word line.

The semiconductor device shown in FIGS. 2 and 3 may be formed using the processes shown in FIGS. 4A to 4J.

Figure 5:
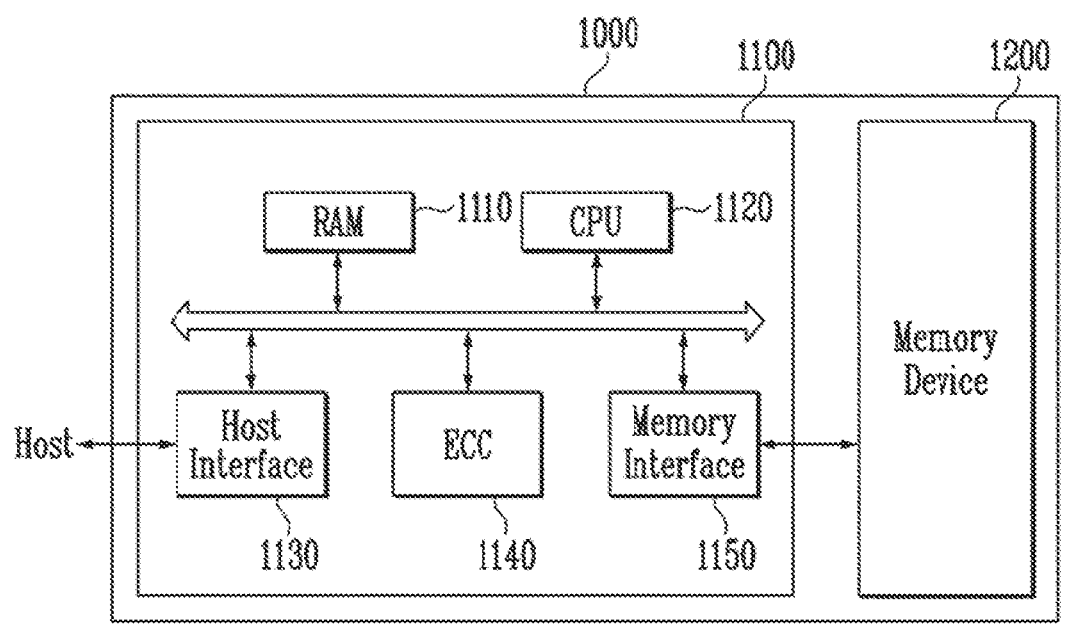
FIG. 5 is a block diagram illustrating a configuration of a memory system according to an embodiment of the present disclosure.

FIG. 5 is a block diagram illustrating a configuration of a memory system according to an embodiment of the present disclosure.

Referring to FIG. 5, the memory system 1000 according to an embodiment of the present disclosure includes a memory device 1200 and a controller 1100.

The memory device 1200 is used to store data information having various data types such as a text, a graphic, and a software code. The memory device 1200 may be the semiconductor device described above with reference to FIGS. 1 to 3, and may be manufactured according to the manufacturing method described with reference to FIGS. 4A to 4J. Since a structure of the memory device 1200 and a method of manufacturing the memory device 1200 are the same as described above, a detailed description thereof will be omitted.

The controller 1100 is connected to a host and the memory device 1200 and is configured to access the memory device 1200 in response to a request from the host. For example, the controller 1100 is configured to control read, write, erase, and background operations, and the like of the memory device 1200.

The controller 1100 includes a random access memory (RAM) 1110, a central processing unit (CPU) 1120, a host interface 1130, an error correction code circuit 1140, a memory interface 1150, and the like.

Here, the RAM 1110 may be used as an operation memory of the CPU 1120, a cache memory between the memory device 1200 and the host, a buffer memory between the memory device 1200 and the host, and the like. For reference, the RAM 1110 may be replaced with a static random access memory (SRAM), a read only memory (ROM), or the like.

The CPU 1120 is configured to control overall operation of the controller 1100. For example, the CPU 1120 is configured to operate firmware such as a flash translation layer (FTL) stored in the RAM 1110.

The host interface 1130 is configured to perform interfacing with the host. For example, the controller 1100 communicates with the host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The ECC circuit 1140 is configured to detect and correct an error included in data read from the memory device 1200 using an error correction code (ECC).

The memory interface 1150 is configured to perform interfacing with the memory device 1200. For example, the memory interface 1150 includes a NAND interface or a NOR interface.

For reference, the controller 1100 may further include a buffer memory (not shown) for temporarily storing data. Here, the buffer memory may be used to temporarily store data transferred to the outside through the host interface 1130, or to temporarily store data transferred from the memory device 1200 through the memory interface 1150. In addition, the controller 1100 may further include a ROM that stores code data for interfacing with the host.

As described above, since the memory system 1000 according to an embodiment of the present disclosure includes the memory device 1200 having an improved degree of integration and an improved characteristic, a degree of integration and a characteristic of the memory system 1000 may also be improved.

Figure 6:
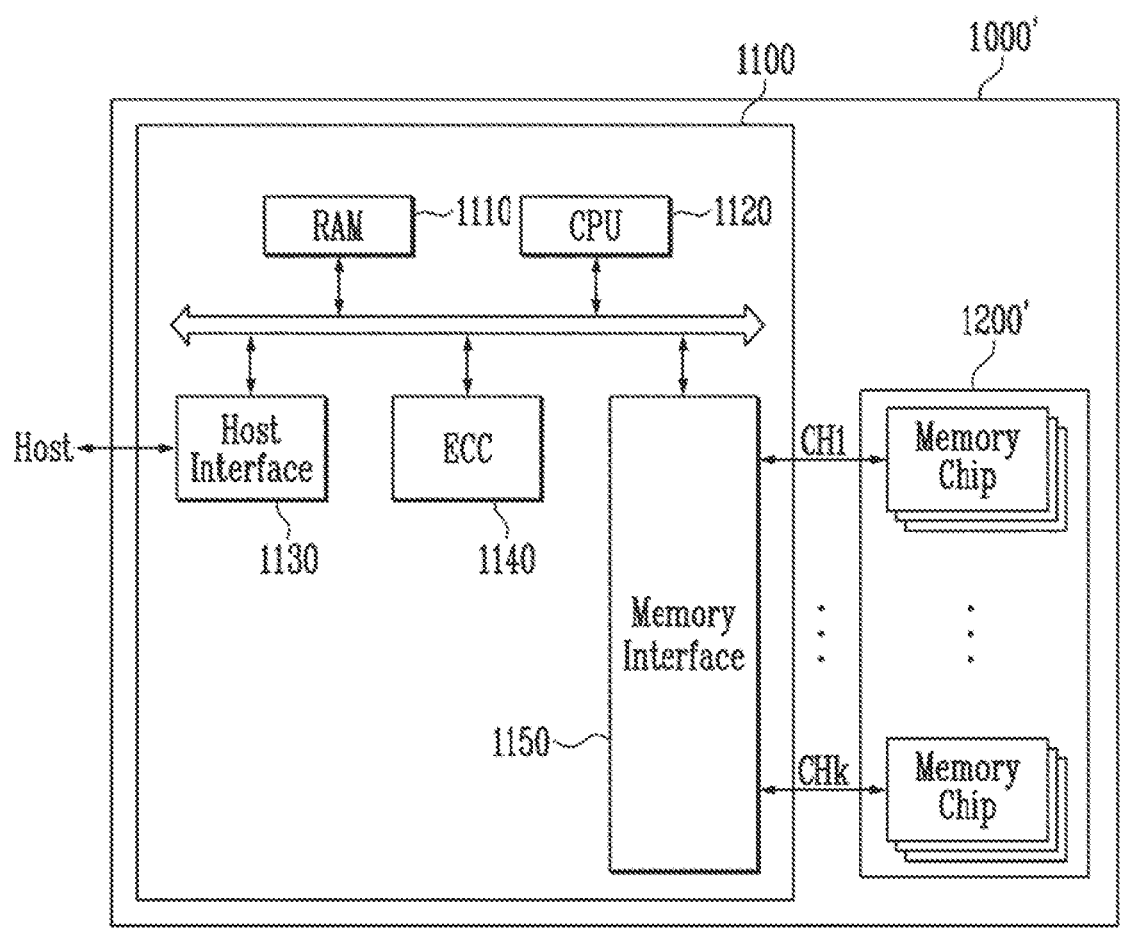
FIG. 6 is a block diagram illustrating a configuration of a memory system according to an embodiment of the present disclosure.

FIG. 6 is a block diagram illustrating a configuration of a memory system according to an embodiment of the present disclosure. Hereinafter, descriptions repetitive to the above description will be omitted.

Referring to FIG. 6, the memory system 1000' according to an embodiment of the present disclosure includes a memory device 1200' and a controller 1100. In addition, the controller 1100 includes a RAM 1110, a CPU 1120, a host interface 1130, an ECC circuit 1140, a memory interface 1150, and the like.

The memory device 1200' may be a nonvolatile memory. The memory device 1200' may be the semiconductor device described above with reference to FIGS. 1 to 3, and may be manufactured according to the manufacturing method described with reference to FIGS. 4A to 4J. Since a structure of the memory device 1200' and a method of manufacturing the memory device 1200' are the same as described above, a detailed description thereof will be omitted.

In addition, the memory device 1200' may be a multi-chip package configured of a plurality of memory chips. The plurality of memory chips are divided into a plurality of groups, and the plurality of groups are configured to communicate with the controller 1100 through first to k-th channels CH1 to CHk. In addition, the memory chips belonging to one group are configured to communicate with the controller 1100 through a common channel. For reference, the memory system 1000' may be modified such that one memory chip is connected to one channel.

As described above, since the memory system 1000' according to an embodiment of the present disclosure includes the memory device 1200' having an improved degree of integration and an improved characteristic, a degree of integration and a characteristic of the memory system 1000' may also be improved. In particular, by configuring the memory device 1200' in a multi-chip package, data storage capacity of the memory system 1000' may be increased and a driving speed may be improved.

Figure 7:
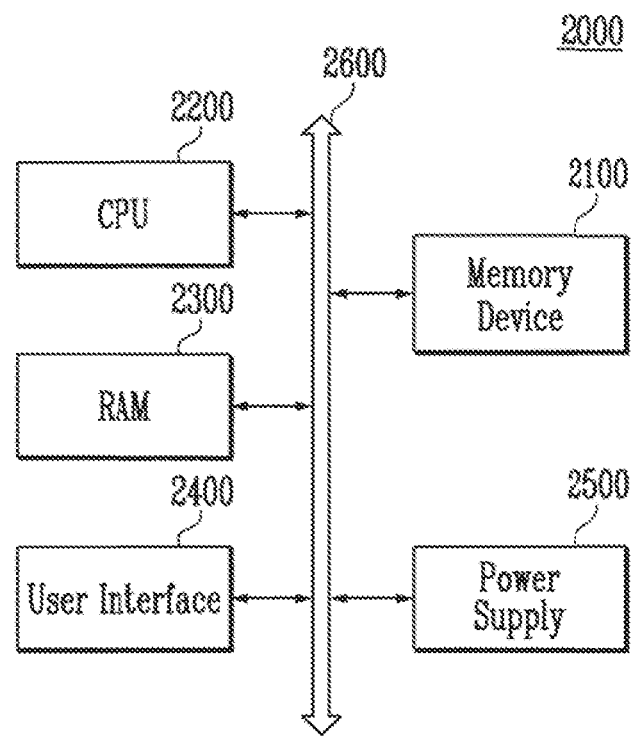
FIG. 7 is a block diagram illustrating a configuration of a computing system according to an embodiment of the present disclosure.

FIG. 7 is a block diagram illustrating a configuration of a computing system according to an embodiment of the present disclosure. Hereinafter, descriptions repetitive to the above description will be omitted.

Referring to FIG. 7, the computing system 2000 according to an embodiment of the present disclosure includes a memory device 2100, a CPU 2200, a RAM 2300, a user interface 2400, a power supply 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power supply 2500, and the like through the system bus 2600. For example, the memory device 2100 may be connected to the system bus 2600 through a controller (not shown) or may be directly connected to the system bus 2600. When the memory device 2100 is directly connected to the system bus 2600, a function of the controller may be performed by the CPU 2200, the RAM 2300, and the like.

Here, the memory device 2100 may be a nonvolatile memory. The memory device 2100 may be the semiconductor device described above with reference to FIGS. 1 to 3, and may be manufactured according to the manufacturing method described with reference to FIGS. 4A to 4J. Since a structure of the memory device 2100 and a method of manufacturing the memory device 2100 are the same as described above, a detailed description thereof will be omitted.

In addition, the memory device 2100 may be a multi-chip package including a plurality of memory chips as described with reference to FIG. 6.

The computing system having such a configuration may be a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or the like.

As described above, since the computing system 2000 according to an embodiment of the present disclosure includes the memory device 2100 having an improved degree of integration and an improved characteristic, a characteristic of the computing system 2000 may also be improved.

Figure 8:
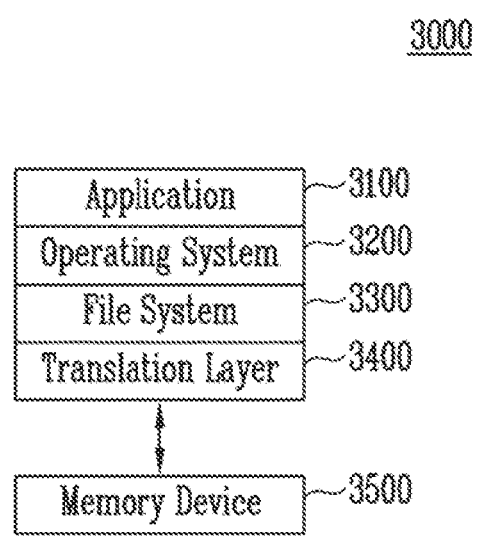
FIG. 8 is a block diagram illustrating a computing system according to an embodiment of the present disclosure.

FIG. 8 is a block diagram illustrating a computing system according to an embodiment of the present disclosure.

Referring to FIG. 8, the computing system 3000 according to an embodiment of the present disclosure includes a software layer including an operating system 3200, an application 3100, a file system 3300, a translation layer 3400, and the like. In addition, the computing system 3000 includes a hardware layer such as a memory device 3500.

The operating system 3200 is for managing software, hardware resources, and the like of the computing system 3000, and may control program execution of a central processing unit. The application 3100 may be various application programs executed on the computing system 3000 and may be a utility that is executed by the operating system 3200.

The file system 3300 refers to a logical structure for managing data, a file, and the like existing in the computing system 3000, and organizes the file or data to be stored in the memory device 3500 according to a rule. The file system 3300 may be determined according to the operating system 3200 used in the computing system 3000. For example, when the operating system 3200 is a Windows system of Microsoft company, the file system 3300 may be a file allocation table (FAT), an NT file system (NTFS), or the like. In addition, when the operating system 3200 is a Unix/Linux system, the file system 3300 may be an extended file system (EXT), a Unix file system (UFS), a journaling file system (JFS), or the like.

Although the operating system 3200, the application 3100, and the file system 3300 are shown as separate blocks in the present figure, the application 3100 and the file system 3300 may be included in the operating system 3200.

The translation layer 3400 converts an address in a form suitable for the memory device 3500 in response to a request from the file system 3300. For example, the translation layer 3400 converts a logical address generated by the file system 3300 into a physical address of the memory device 3500. Here, mapping information of the logical address and the physical address may be stored in an address translation table. For example, the translation layer 3400 may be a flash translation layer (FTL), a universal flash storage link layer (ULL), or the like.

The memory device 3500 may be a nonvolatile memory. The memory device 3500 may be the semiconductor device described above with reference to FIGS. 1 to 3, and may be manufactured according to the manufacturing method described with reference to FIGS. 4A to 4J. Since a structure of the memory device 3500 and a method of manufacturing the memory device 3500 are the same as described above, a detailed description thereof will be omitted.

The computing system 3000 having such a configuration may be divided into an operating system layer that is performed in a higher level region and a controller layer that is performed in a lower level region. Here, the application 3100, the operating system 3200, and the file system 3300 may be included in the operating system layer and may be driven by an operation memory of the computing system 3000. In addition, the translation layer 3400 may be included in the operating system layer or in the controller layer.

As described above, since the computing system 3000 according to an embodiment of the present disclosure includes the memory device 3500 having an improved degree of integration and an improved characteristic, a characteristic of the computing system 3000 may also be improved.

What is claimed is:

1. A semiconductor device comprising:
 a first source layer spaced apart from a substrate and overlapping with a cell region of the substrate;

a second source layer spaced apart from the substrate and overlapping with a discharge contact region of the substrate;

a cell stack including cell interlayer insulating layers and conductive patterns alternately stacked on the first source layer; and a channel structure passing through the cell stack and extending into the first source layer, wherein the channel structure includes an upper channel structure passing through the cell stack and a lower channel structure disposed below the cell stack, and a connection portion of the upper channel structure and the lower channel structure has a bottleneck pattern.

2. The semiconductor device of claim 1, wherein a threshold dimension of a lowermost end of the upper channel structure is less than a critical dimension of an uppermost end of the lower channel structure.

3. The semiconductor device of claim 1, wherein the lower channel structure comprises:

a core insulating layer extending in a vertical direction;

a channel layer surrounding a sidewall and a lower surface of the core insulating layer;

a first memory layer surrounding an upper sidewall of the channel layer; and a second memory layer surrounding a lower sidewall and a lower surface of the channel layer, and the first memory layer and the second memory layer are spaced apart from each other by a distance to expose a portion of a sidewall of the channel layer.

4. The semiconductor device of claim 3, wherein the first source layer includes a first semiconductor layer, a second semiconductor layer, and a third semiconductor layer sequentially stacked, and the second semiconductor layer is in direct contact with the exposed portion of the sidewall of the channel layer.

5. The semiconductor device of claim 4, wherein the second source layer includes the first semiconductor layer, a first protective layer, a second protective layer, and the third semiconductor layer sequentially stacked.

6. The semiconductor device of claim 1, further comprising:

a conductive contact plug passing through the second source layer to be in contact with the substrate.

7. The semiconductor device of claim 6, further comprising:

a dummy stack including dummy interlayer insulating layers and sacrificial insulating layers alternately stacked on the conductive contact plug.

8. The semiconductor device of claim 1, further comprising:

a buffer layer disposed between the first source layer and the cell stack.

9. The semiconductor device of claim 1, wherein an upper surface of the lower channel structure is in contact with a lower surface of the cell stack.

10. The semiconductor device of claim 1, wherein the connection portion of the upper channel structure and the lower channel structure is located at the same level as an interface between the first source layer and the cell stack.

* * * * *